United States Patent [19]
Shrivastava et al.

[11] Patent Number: 6,020,237
[45] Date of Patent: Feb. 1, 2000

[54] METHOD OF REDUCING DIELECTRIC DAMAGE DUE TO CHARGING IN THE FABRICATION OF STACKED GATE STRUCTURES

[75] Inventors: Ritu Shrivastava, Fremont; Chitranjan N. Reddy, Los Altos Hills, both of Calif.

[73] Assignee: Alliance Semiconductor Corporation, San Jose, Calif.

[21] Appl. No.: 09/018,775

[22] Filed: Feb. 4, 1998

[51] Int. Cl.$^7$ ............................................. H01L 21/8247
[52] U.S. Cl. ........................................ 438/257; 438/281
[58] Field of Search ........................... 438/4, 257–267, 438/281

[56] References Cited

U.S. PATENT DOCUMENTS

| | | | |
|---|---|---|---|
| 4,543,597 | 9/1985 | Shibata | 357/23.6 |
| 4,698,787 | 10/1987 | Mukherjee et al. | 365/185 |
| 4,868,619 | 9/1989 | Mukherjee et al. | 357/23.5 |
| 5,049,514 | 9/1991 | Mori | 437/41 |
| 5,083,172 | 1/1992 | Kiyono | 357/23.6 |
| 5,434,108 | 7/1995 | Ko et al. | |
| 5,466,622 | 11/1995 | Cappelletti | |
| 5,514,623 | 5/1996 | Ko et al. | |
| 5,851,880 | 12/1998 | Ikegami | 438/258 |

*Primary Examiner*—Richard Booth
*Attorney, Agent, or Firm*—Haverstock & Owens LLP

[57] ABSTRACT

A method of fabricating structures to reduce dielectric damage due to charging is easily incorporated into existing stacked gate fabrication processes. The conductive layers are patterned to form structures which are coupled to the substrate by a current passing device. Each current passing device is isolated from the control gate structures toward the end of the etch process, thereby providing a discharge path for the control gate structures throughout substantially all of the stacked gate etch step. First and second conductive layers are patterned with one or more masks to create stacked gate structures. The multiple masks minimize the exposed area of the second conductive layer during the etch process and so reduce the amount of charging on the gate structures. Each current passing device is preferably an interconnect via coupling the second conductive layer to the first conductive layer. The discharge path allows charge to travel from the second conductive layer through the via to the first conductive layer. From the first conductive layer the charge can travel to the substrate through a buried contact structure.

29 Claims, 5 Drawing Sheets

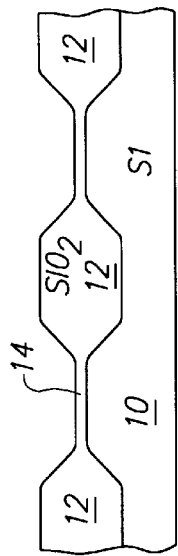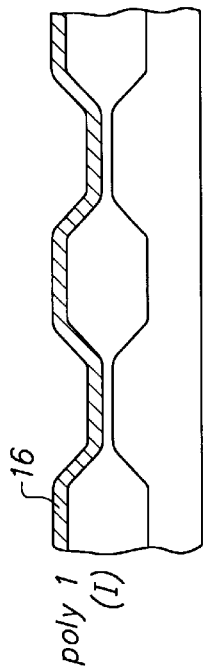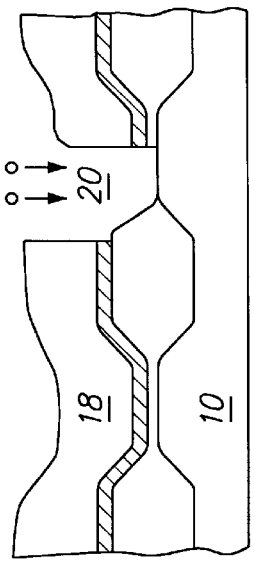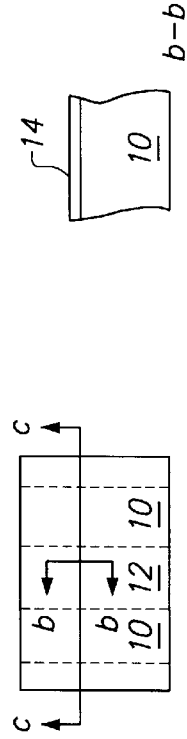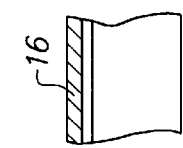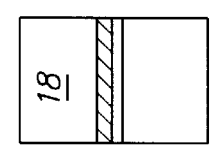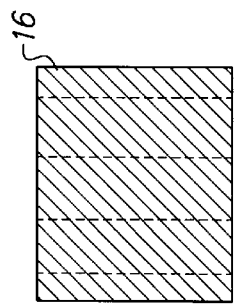

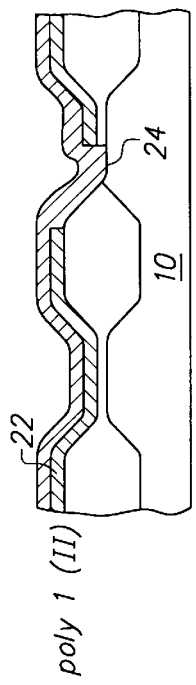
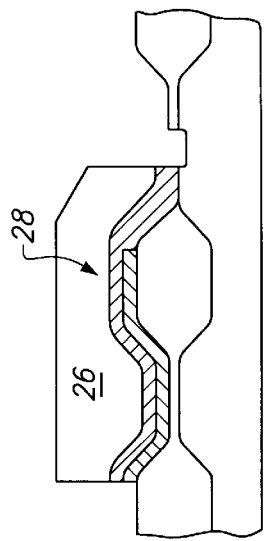
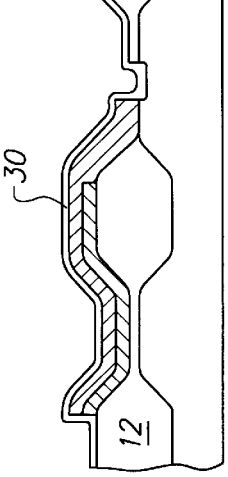
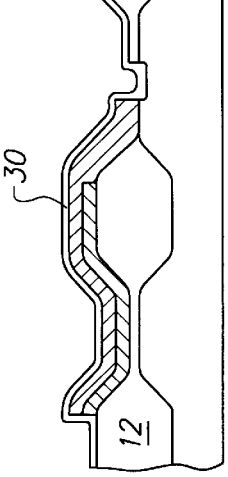

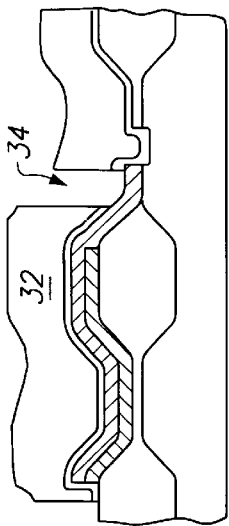
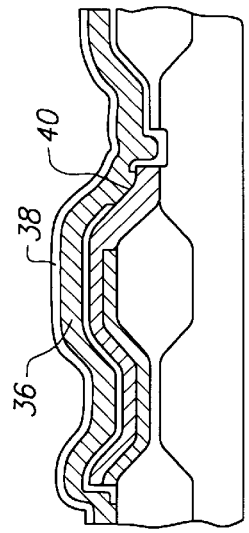
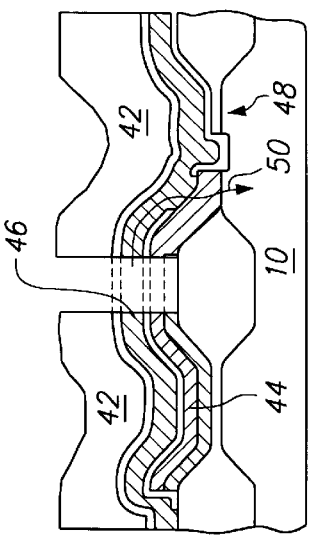
FIG. 8C    FIG. 9C    FIG. 10C
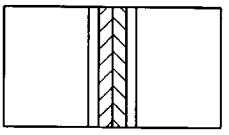
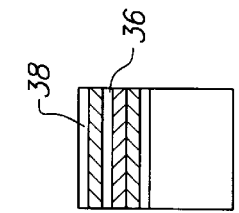
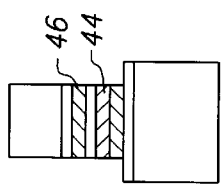
FIG. 8B    FIG. 9B    FIG. 10B
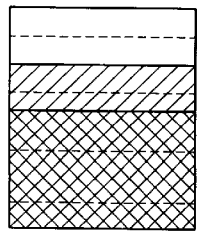
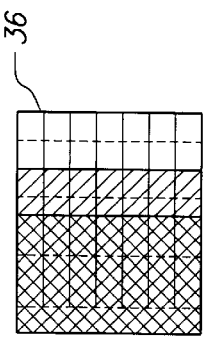
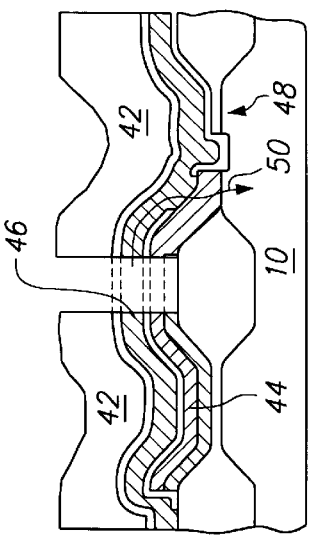
FIG. 8A    FIG. 9A    FIG. 10A

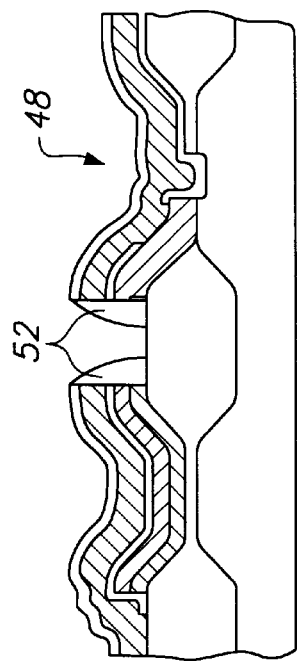
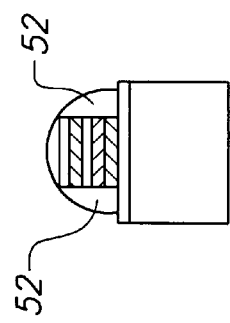
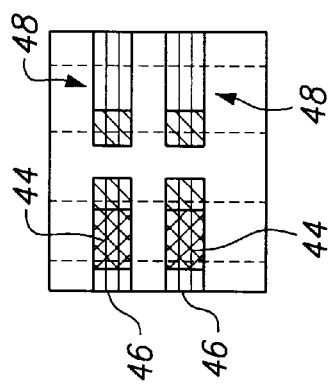
FIG. 11C
FIG. 11B
FIG. 11A

METHOD OF REDUCING DIELECTRIC DAMAGE DUE TO CHARGING IN THE FABRICATION OF STACKED GATE STRUCTURES

FIELD OF THE INVENTION

The present invention relates to the field of processes for manufacturing semiconductor electronic devices. More particularly, the present invention relates to the field of methods for reducing charge induced damage by various steps in the manufacturing process of semiconductor devices employing stacked gate structures.

BACKGROUND OF THE INVENTION

Both programmable read-only-memories (PROMs) and programmable logic devices often use floating gate structures for storing data or establishing a desired logic function One way to utilize floating gates, is to place the floating gate between a transistor channel and a control gate. The presence or absence of charge stored in the floating gate is used to alter the threshold of the transistor. For many non-volatile memories a cell is programmed by placing electrons on a floating gate and erased by removing electrons from the floating gate.

In conventional electrically programmable read-only-memories (EPROMs), electrons are placed on the floating gate by channel hot electron injection. In conventional electrically erasable read-only-memories (EEPROMs), Fowler-Nordheim tunnelling is used to charge and discharge the floating gate. In "Flash" EPROMs, floating gates are typically programmed by channel hot electron injection, and erased by Fowler-Nordheim tunnelling. Capacitive coupling, in these stacked gate structures, to the control gate, creates the field across the floating gate necessary to accumulate the electrons. One particularly compact structure utilizing a floating gate is the one transistor flash memory stacked cell, as set forth in U.S. Pat. No. 4,698,787 issued to Mukherjee et al. on Oct. 6, 1987 and entitled SINGLE TRANSISTOR ELECTRICALLY PROGRAMMABLE MEMORY DEVICE AND METHOD.

In order to maximize the capacitive coupling between the control gate and the floating gate, the dielectric separating the two is fabricated with as thin a layer as is possible, and from a material having a high dielectric constant. It is known in the prior art to pattern polysilicon to form the floating gate. The dielectric is then formed by creating an insulation film on the floating gate. This insulation film is typically created by thermally growing silicon oxide, depositing silicon nitride, and then re-oxidizing the silicon nitride to create an oxidized-nitride-oxide (ONO) layer. Because the control gate and the floating gate are typically patterned from polysilicon, this dielectric layer is often referred to as the inter-poly dielectric. Similarly, a thin dielectric layer referred to as tunnel oxide, exists between floating poly and the channel.

A problem that occurs during the fabrication of stacked gate structures is that unintentional charging of the conductive layers, such as the floating gate and the control gate, causes breakdown of the inter-poly dielectric during fabrication. Many of the integrated circuit fabrication steps, reactive ion etching (RIE) in particular, can cause charge accumulation in these conductive layers. For the case of stacked gate structures, the control gates can accumulate charge during these fabrication steps causing the inter-poly dielectric layer to breakdown thereby shorting the floating gate to the control gate. This destroys the memory cell.

While the same problem may occur in the tunnel dielectric, between the floating gate and substrate, breakdown of the inter-poly dielectric is more likely because the breakdown voltage of the tunnel dielectric is greater than that of the inter-poly dielectric.

It is known in the prior art to modify MOS fabrication processes to prevent the breakdown of MOS gate dielectrics due to charge accumulation. Shibata et al. in U.S. Pat. No. 4,543,597 issued on Sep. 24, 1985 and entitled DYNAMIC SEMICONDUCTOR MEMORY AND MANUFACTURING METHOD THEREOF, and Seiichi Mori in U.S. Pat. No. 5,049,514 issued on Sep. 17, 1991 and entitled METHOD OF MAKING A MOS DEVICE HAVING A POLYCIDE GATE, both teach fabrication methods in which the gate oxide is protected by coupling a polysilicon gate to the substrate by way of a p-n junction. If the gate is charged with one type of polarity, the p-n junction is forward biased and the gate is discharged to the substrate. If the gate is charged to the opposite polarity, reverse bias leakage of the p-n junction discharges the gate. Alternatively, the gate makes ohmic contact with the substrate by way of a p-n junction during the first part of the fabrication process. In either method, the gate is then subsequently isolated from the substrate by an etch or oxidation step.

Junji Kiyono in U.S. Pat. No. 5,083,172 issued on Jan. 21, 1992 and entitled DYNAMIC RANDOM ACCESS MEMORY DEVICE FABRICATED WITH TWO KINDS OF FIELD EFFECT TRANSISTOR DIFFERENT IN THICKNESS OF GATE OXIDE FILMS discloses a dynamic random access memory wherein gate electrodes are coupled to a first gate oxide to form active devices, and to a second gate oxide, thinner than the first. In the event the gate electrodes accumulate undesirable charge, a discharge path is formed through the second gate oxide protecting the first gate oxide of the active devices.

None of the references discussed above teach a method of eliminating the adverse effects of charge accumulation in the fabrication of stacked gate structures. What is needed is a method of eliminating the adverse effects of charge accumulation in the fabrication of stacked gate structures. What is further needed is a method of fabricating a semiconductor device with a stacked gate structure and an inter-poly dielectric wherein charge damage to the inter-poly dielectric is minimized during fabrication.

SUMMARY OF THE INVENTION

According to the present invention, a method of fabricating a stacked gate cell which is easily incorporated into existing fabrication processes includes patterning a number of floating gate structures from a first conductive layer, forming a dielectric layer over the floating gate structures and forming a second conductive layer over the dielectric layer. The second conductive layer is patterned to form control gate structures which are coupled to the substrate by a current passing device. Each current passing device is isolated from the control gate structures toward the end of the fabrication process, thereby providing a discharge path for the control gate structures throughout substantially all of the stacked gate fabrication steps.

According to the preferred embodiment of the present invention, each current passing device is an interconnect via connecting the second conductive layer to the first conductive layer. The discharge path allows charge to travel from the second conductive layer through the via to the first conductive layer. From the first conductive layer the charge can travel to the substrate through a buried contact structure.

According to one aspect of the present invention, the first and second conductive layers are patterned and etched using one or more masks in the process of creating stacked gate structures. The multiple masks minimize the exposed area of the second conductive layer during the fabrication process and so reduce the amount of charging on the gate structures.

BRIEF DESCRIPTION OF THE DRAWINGS

FIG. 2(A)–11(C) illustrate a method of fabricating a flash EPROM cell according to the preferred embodiment of the present invention.

DETAILED DESCRIPTION OF THE PREFERRED EMBODIMENT

Figure 1:
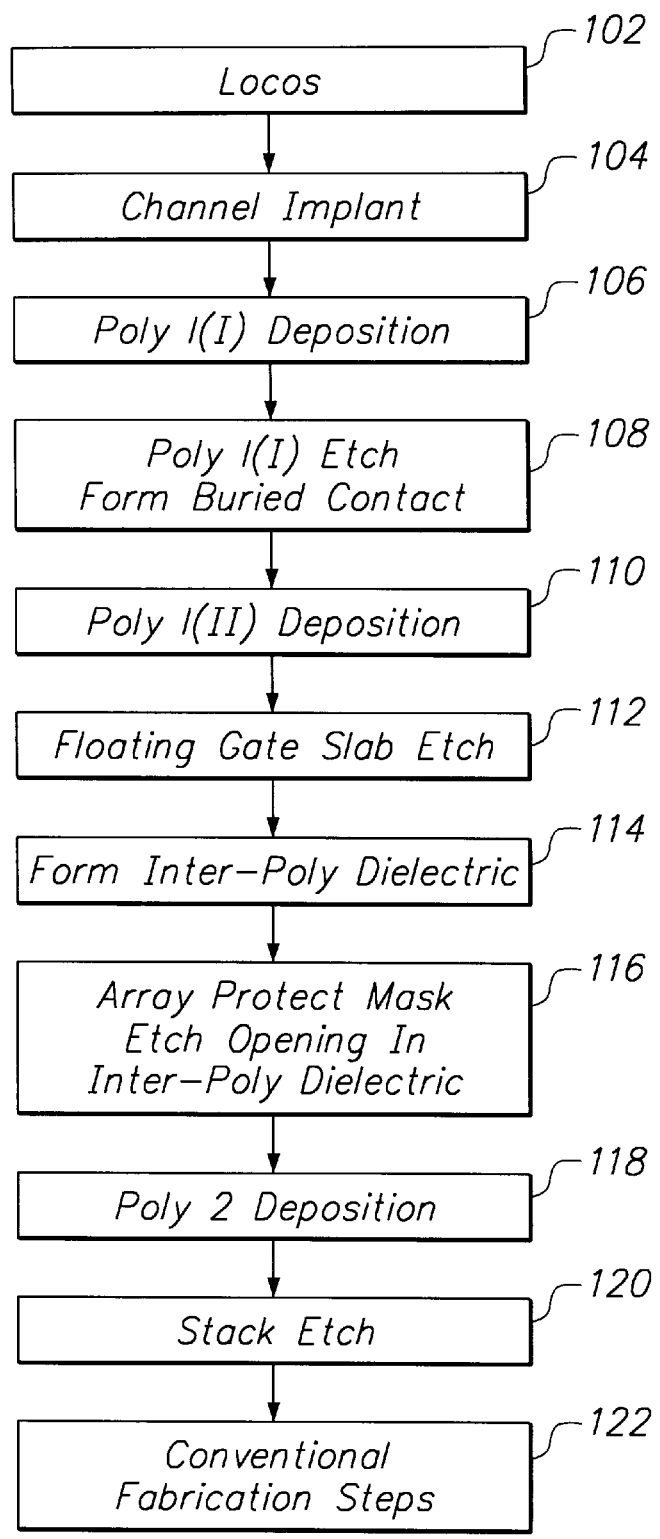
FIG. 1 illustrates a flow chart of the method of manufacturing a flash EPROM according to the preferred embodiment of the present invention.

A method of reducing dielectric damage due to charging in the fabrication of stacked gate structures is easily incorporated into existing fabrication processes and includes formation of a buried contact, patterning a number of floating gate structures from a first conductive layer, forming a dielectric layer over the floating gate structures and forming a second conductive layer over the dielectric layer. The second conductive layer is patterned to form control gate structures and is coupled to the substrate by a current passing device. The current passing device is isolated from the control gate structures toward the end of the etch process, thereby providing a discharge path for the control gate structures throughout substantially all of the stacked gate etch step. The current passing device provides a discharge path from the second conductive layer through the first conductive layer and a buried contact structure to the substrate. Charge which would otherwise be built up on the conductive layers during fabrication is discharged through this discharge path. One current passing device can be configured to discharge a plurality of stacked gate structures.

Another aspect of the present invention is to divide the array into portions during the etching steps so that only a portion of the array is masked and etched at any one time. Each portion of the array is then masked and etched in turn, thereby minimizing the amount of the array that is exposed to the etching process at any one time.

The method of the present invention is preferably used to form one-transistor (1-T) stacked gate non-volatile memory (NVM) cells, which are arranged in rows and columns to form an EPROM, EEPROM or flash EPROM array. The array is divided into sectors (or blocks) composed of a number of sub-arrays, with the cells of the same sub-array row having floating gates that are capacitively coupled to the same control gate. Cells of the same sub-array column have drain regions that are commonly coupled to the same bit lines. Array sectors have commonly coupled source nodes. Alternatively, the method of the present invention can be used to form any appropriate stacked gate architecture.

A flow diagram illustrating the steps within the fabrication process of the preferred embodiment of the present invention is illustrated in FIG. 1. FIGS. 2–11 illustrate the various steps in the process set forth in FIG. 1. FIGS. 2–11 each include an a, b and c part. FIG. 2a and the corresponding FIGS. 3a, 4a . . ., 11a, each illustrate a top plan view. FIG. 2b and the corresponding FIGS. 3b, 4b . . ., 11b, each illustrate a side, cross-sectional view taken along the line b—b of FIG. 2a. FIG. 2c and the corresponding FIGS. 3c, 4c . . . , 11c, each illustrate a side, cross-sectional view taken along the line c—c of FIG. 2a.

The process begins with an isolation process such as a local oxidation of silicon (LOCOS) step 102. Field oxide regions 12 are formed in the substrate 10, separated by a thin layer of sacrificial oxide 14. The active regions are established by a subsequent ion implantation step 104 through the sacrificial oxide 14 and are used to establish the threshold voltage of the cell. The cell following the steps 102 and 104 is set forth in FIGS. 2a–2c, though the channel implant operation is not shown. The isolation process is designed to achieve an acceptable field threshold voltage to route high voltages in the periphery, and field oxide thickness that gives rise to high coupling coefficients.

Following the channel implant step 104, the sacrificial oxide 14 is etched away and a tunnel oxide is grown over the active areas. In the preferred embodiment the tunnel oxide has a thickness in the range of 80–100 Angstroms. Following the formation of the tunnel oxide, the gate structure is formed. This structure is preferably formed by building conductive material using two steps to form a region having a thinner cross sectional area in the region of a buried contact. A first layer of polysilicon (poly 1(I)) 16 is deposited (step 106), as illustrated in FIGS. 3a–3c. This poly 1(I) layer 16 is used to protect the tunnel oxide in the buried contact formation of the present invention. In the preferred embodiment of the present invention, the poly 1(1) layer 16 is deposited using a conventional polysilicon chemical vapor deposition process resulting in amorphous or polycrystalline grain structures. Typical deposition temperatures are ~570° C. for amorphous silicon, and ~630° C. for polycrystalline silicon. Doping of the poly 1(I) layer 16 is governed by subsequent oxide growth, and can be done in situ, or using ion implantation. An in situ doping technique using phosphoryl tricholoride ($POCl_3$), or ion implant may be used to dope the poly 1(I) layer 16. For ion implantation, typical implant doses of phosphorous are ~$5 \times 10^{15}/cm^2$.

After the deposition of the poly 1(I) layer 16, a buried contact etch mask 18 is created over the poly I layer 16 using conventional photolithography, and the poly 1(I) layer 16 is subjected to an anisotropic etch (step 108). This anistropic etch etches through both the poly 1(I) layer 16 and the tunnel oxide 12 in order to expose the substrate 10 and form a buried contact opening 20, as illustrated in FIGS. 4a–4c. After this step, the poly 1(I) etch mask 18 is stripped off.

A second thicker layer of polysilicon (poly 1(II)) 22 is next deposited (step 110), as illustrated in FIGS. 5a–5c. The poly 1(II) layer 22 covers the poly 1(I) layer 16 and the buried contact opening 20. In the preferred embodiment of the present invention, this poly 1(II) layer 22 is also deposited using a conventional polysilicon chemical vapor deposition process resulting in amorphous or polycrystalline grain structures. Doping of the poly 1(II) layer 22 is governed by subsequent oxide growth, and can be done in situ, or using ion implantation, as described above in reference to the doping of the poly 1(I) layer 16. Preferably, the poly 1(II) layer 22 is a combination of the polysilicon of the poly 1(II) layer and silicide. This poly 1(II) layer 22 forms a buried contact 24 with the substrate 10. As described above, the preferred embodiment of the present invention involves depositing the poly 1(I) layer 16 and the poly 1(II) layer 22 in two steps. Alternatively, if the process is clean enough, this first poly layer can be formed in one deposition step following a buried contact etch step.

A floating gate structure, or floating gate "slab" 28 is formed (step 112) after the poly 1(II) layer 22 is deposited. In the preferred embodiment this step includes the simultaneous etching of both the poly 1(I) layer 16 and the poly 1(II) layer 22. The floating gate slab 28 includes the remaining portions of the poly 1(I) layer 16 and the poly 1(II) layer 22. As illustrated in FIGS. 6a–6c, a poly 1(II) etch mask 26 of photoresist is developed along the channel width of the EPROM cell. The poly 1(II) etch mask 26 overlaps portions of the poly 1(I) slab 16. It is noted that this mask is the same mask that is used to pattern the floating gate in a conventional 1-T cell flash EPROM process. This enables the method of the present invention to be readily integrated into the existing flash EPROM processes. The floating gate slab 28 is preferably formed by an anisotropic reactive ion etch which etches through the poly 1(I) layer 16 and the poly 1(II) layer 22 down to the field oxide 12. The poly 1(II) etch mask 26 is then stripped off.

After forming the floating gate slab 28, the inter-poly dielectric is formed (step 114), as illustrated in FIGS. 7a–7c. The inter-poly dielectric 30 covers the exposed areas of the floating gate slab 28 and the field oxide 12. In the preferred embodiment of the present invention, a composite ONO layer is used for the inter-poly dielectric 30. This layer is produced by a first oxidation step which oxidizes the exposed polysilicon surfaces following the poly 1(I)–poly 1(II) etch (step 112). A layer of silicon nitride is then deposited. The silicon nitride is subsequently oxidized to produce another layer of silicon dioxide. In the preferred embodiment, the bottom oxide layer has a thickness in the range of 50–150 Angstroms, and is formed by a dry oxidation at ~1000° C. The middle nitride layer is formed by conventional silicon nitride deposition techniques and has a thickness in the range of ~100 to ~250 Angstroms. The top oxide layer has a thickness in the range of 20–70 Angstroms.

The entire cell array is then covered by an array protect mask 32 and the openings 34 in the ONO inter-poly dielectric layer 30 is etched away, thereby exposing the floating gate slab 28 (step 116), as illustrated in FIGS. 8a–8c. With the array protected from etch steps, initial gate areas for peripheral transistor structures are formed by etching channel regions, and growing gate oxide for MOS transistor devices peripheral to the cell array, as is conventional. The array protect mask 32 is then stripped off.

A third layer of polysilicon 36 (poly 2) is then deposited (step 118) to cover the inter-poly dielectric 30 (FIG. 7c) and the exposed areas of the floating gate slab 28 (FIG. 6c) and the field oxide 12 (FIG. 7c), as illustrated in FIGS. 9a–9c. In the preferred embodiment of the present invention, the poly 2 layer 36 has a thickness in the range of 1000–2000 Angstroms. The poly 2 layer 36 has a polycrystalline grain structure and is preferably deposited at a temperature in the range of ~630° C. Doping of this layer is achieved either by in situ doping, or by ion implantation. The poly 2 layer 36 contacts the floating gate slab at the contact area 40. This is easily achieved by using a via mask to define this contact area. As described above, the floating gate slab 28 (FIG. 6c) is also in contact with the substrate through the buried contact. According to well understood techniques, a layer of tungsten silicide is deposited and annealed with the poly 2 layer 36 to create a $WSi_2$/poly 2 layer. In the preferred embodiment of the present invention, following the deposition of the poly 2 layer 36, a layer of oxide is formed, thereby forming a cap layer 38.

After the $WSi_2$/poly 2 layer is formed, a stack etch step 120 is performed as illustrated in FIG. 10a–10c. In the stack etch step 120, a stack etch mask 42 is formed from photoresist over the $WSi_2$/poly 2 layer. The stack etch mask 42 defines the word lines of the array, and runs in strips, defining the cell channel length. Once the stack etch mask 42 is formed, an anisotropic stack etch is applied. The stack etch etches through the exposed portions of the cap layer 38 (FIG. 9c), the $WSi_2$/poly 2 layer and the floating gate slab 28 (FIG. 6c), down to the field oxide (or tunnel oxide if an active area is underneath). (Note that earlier etching of the floating gate slab 28 (FIG. 6c) using floating poly mask creates the floating gate 44.) The etching of the poly 2 layer 36 results in the overlying control gate 46. The stack etch mask 42 is then stripped off.

During this stack etch step, the contact between the poly 2 layer 36, the floating gate slab 28 and the substrate 10, provides a charge-discharge route in order to minimize the charge built up on the conductive poly layers during this stack etch. This charge-discharge route is formed by the current passing device 48 and illustrated by the reference numeral 50 in FIG. 10c. The current passing device 48 is isolated, relatively slowly from the control gate structure 46 by the stack etch process, thereby providing a discharge path 50 for the control gate structures throughout substantially all of the stacked gate fabrication steps. Because of this discharge path 50, from the control gate structure 46, through the floating gate slab, to the substrate 10, the amount of charge built up between the control gate structure 46 and the floating gate structure 44 is minimized. This serves to minimize the breakdown of the inter-poly dielectric and accordingly, increase the yield of devices manufactured according to the process of the present invention.

The last step 122 of the process of the present invention includes conventional fabrication steps of depositing a spacer oxide and conducting a spacer etch. The stacked gate structure that results following the stack etch is illustrated in FIG. 11a–11c and has spacers 52 formed thereon after the appropriate sealing oxidation. Self-aligned common source regions can then be etched. Subsequent dielectric contact and metallization steps follow. As these steps are well understood in the art, they are not described here in detail so as to not unnecessarily complicate the description of the present invention. The resulting stacked gate structure is conventional and will operate according to conventional principles.

In an alternate embodiment of the present invention, the etch steps are divided into sub steps, so that only a portion of the array is etched at a time in order to further minimize the charge built up on the conductive layers. The amount of charge generated in a conductive layer relates to the amount of area of the conductive layer that is exposed during the etching process. In this alternate embodiment, during the floating gate slab etch step, the array is divided into two or more portions and only a portion of the array is masked and then etched at any one time. This is repeated for each portion of the array until the entire array has been etched and the floating gate slabs are formed. After the poly 2 layer has been deposited, during the stack etch step, the array is again divided into two or more portions and only a portion of the array is masked and then etched to form the word lines, at any one time. This is repeated for each portion of the array until the entire array has been etched and the word lines are all formed. Accordingly, the charge built up on the conductive layers of the array during the etch step will be reduced by etching only a portion of the array at a time and will be further minimized due to the discharge path provided through the current passing device 48.

In the process of the present invention, a current passing device 48 is associated with a predetermined number of word lines within the array during the etch steps, in order to provide a discharge path for the conductive layers corresponding to the word lines. In the preferred embodiment of the present invention each current passing device 48 is associated with eight word lines. However, as should be apparent to those skilled in the art, the current passing device 48 can alternatively be associated with any appropriate number of word lines.

The method of reducing dielectric damage due to charging in the fabrication of stacked gate structures of the present invention provides a current passing device 48 through which current is passed from the conductive layers of the structure to the substrate. This method is easily incorporated into existing fabrication processes. This fabrication method serves to increase the yield of stacked gate structures by reducing the likelihood that the dielectric will break down during fabrication due to charge building up on the conductive layers. In a further embodiment of the present invention, the array is etched in portions in order to further minimize the amount of charge built up on the conductive layers during the etch process.

The present invention has been described in terms of specific embodiments incorporating details to facilitate the understanding of principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

We claim:

1. A method of reducing charge induced damage in the fabrication of stacked gate integrated circuits comprising the steps of:
   a. forming active regions in a substrate;
   b. forming a plurality of floating gate structures and at least one discharge structure from a first conductive layer; and
   c. forming a contact from the floating gate structures to at least the discharge structure.

2. The method as claimed in claim 1 wherein step b includes
   opening a contact hole to the substrate; and
   depositing the first conductive layer such that the first conductive layer makes electrical contact with the substrate through the contact hole to form the discharge structure.

3. The method as claimed in claim 2 wherein step a includes
   providing a substrate of a first conductivity type, and
   forming regions of a second conductivity type therein; and step b includes
   opening the contact hole to the substrate in one of the regions of the second conductivity type.

4. The method as claimed in claim 3 further comprising the steps of
   depositing a second conductive layer such that the second conductive layer makes electrical contact with at least the discharge structure; and
   patterning at least the second conductive layer to form control gates.

5. The method as claimed in claim 4 wherein the step of patterning the second conductive layer is performed on only a portion of an array at any one time, until all portions of the array have been patterned.

6. A method of reducing charge induced damage in the fabrication of stacked gate integrated circuits comprising the steps of:
   a. forming active regions in a substrate;
   b. forming a plurality of floating gate structures and at least one discharge structure from a first conductive layer;
   c. forming a contact to at least the discharge structure;
   d. depositing a second conductive layer such that the second conductive layer makes electrical contact with at least the discharge structure; and
   e. patterning at least the second conductive layer to form control gates.

7. The method as claimed in claim 6 wherein step b includes
   opening a contact hole to the substrate; and
   depositing the first conductive layer such that the first conductive layer makes electrical contact with the substrate through the contact hole to form the discharge structure.

8. The method as claimed in claim 7 wherein step a includes
   providing a substrate of a first conductivity type, and
   forming regions of a second conductivity type therein; and step b includes
   opening the contact hole to the substrate in one of the regions of the second conductivity type.

9. The method as claimed in claim 7 wherein step b further includes forming a tunnel dielectric on the substrate;
   depositing the first conductive layer; and
   patterning the first conductive layer such that the discharge structure is a portion of the second conductive layer that is isolated from the substrate by the tunnel dielectric.

10. The method as claimed in claim 9 wherein the step of patterning the second conductive layer is performed on only a portion of an array at any one time, until all portions of the array have been patterned.

11. The method as claimed in claim 10 wherein the step of patterning the first conductive layer is performed on only a portion of an array at any one time, until all portions of the array have been patterned.

12. The method as claimed in claim 6 wherein the first conductive layer is doped polysilicon.

13. The method as claimed in claim 6 wherein the second conductive layer is doped polysilicon.

14. The method as claimed in claim 6 wherein step b includes depositing a first conductive layer of polysilicon;
   patterning the first conductive layer;
   oxidizing the first conductive layer to form a first silicon dioxide layer;
   depositing a layer of silicon nitride over the first silicon dioxide layer; and
   oxidizing the silicon nitride layer to form a second silicon dioxide layer.

15. The method as claimed in claim 6 wherein step e includes isolating the discharge structure from the control gates.

16. The method as claimed in claim 15 wherein step e includes etching through the first conductive layer and second conductive layer to form stacked gate structures.

17. A method of reducing charge induced damage in the fabrication of stacked gate integrated circuits comprising the steps of:
   a. forming active regions in a substrate;
   b. forming a plurality of floating gate structures from a first conductive layer;
   c. depositing a second conductive layer such that an electrical contact is formed between the second conductive layer and the first conductive layer; and
   d. patterning at least the second conductive layer to form control gates.

18. The method as claimed in claim 17 wherein the control gates are isolated from the electrical contact during the step of patterning at least the second conductive layer.

19. The method as claimed in claim 18 wherein the step of patterning the second conductive layer is performed on only a portion of an array at any one time, until all portions of the array have been patterned.

20. The method as claimed in claim 19 further comprising the step of forming at least one discharge structure from the first conductive layer, wherein a discharge path is formed from the electrical contact to the discharge structure.

21. A method during a manufacturing operation of reducing charge between two conductive layers formed over a semiconductor substrate comprising the steps of:
   a. forming a first conductive layer, wherein the first conductive layer is electrically coupled to the substrate through a contact but otherwise substantially enclosed within an electrical insulator;
   b. forming a second conductive layer over the first conductive layer, wherein the second conductive layer is electrically coupled to the first conductive layer over the contact but otherwise substantially enclosed within an electrical insulator; and
   c. selectively and concurrently isolating a region of the first conductive layer and the second conductive layer from the contact such that charge between the first conductive layer and the second conductive layer is minimized.

22. The method as claimed in claim 21 wherein the first conductive layer is doped polysilicon.

23. The method as claimed in claim 21 wherein the second conductive layer is doped polysilicon.

24. The method as claimed in claim 21 wherein step c includes etching through the first conductive layer and the second conductive layer to form stacked gate structures.

25. A method of reducing charge induced damage in the fabrication of stacked integrated circuits comprising the steps of:
   a. etching one of a plurality of portions of an array thereby forming floating gate structures and at least one discharge structure from a first conductive layer, wherein only one portion of the array is etched at any one time; and
   b. repeating step a until all of the plurality of portions of the array have been etched.

26. The method as claimed in claim 25 further comprising the steps of:
   a. forming a contact to at least the discharge structure;
   b. depositing a second conductive layer such that the second conductive layer makes electrical contact with at least the discharge structure; and
   c. patterning at least the second conductive layer to form control gates by etching the second conductive layer in two or more portions, one portion at a time.

27. The method as claimed in claim 26 wherein the first and second conductive layers are doped polysilicon.

28. The method as claimed in claim 27 wherein the step of patterning includes isolating the discharge structure from the control gates.

29. The method as claimed in claim 28 wherein the step of patterning further includes etching through the first and second conductive layers to form stacked gate structures.

* * * * *